United States Patent
Hiraide

(10) Patent No.: US 7,337,379 B2
(45) Date of Patent: Feb. 26, 2008

(54) APPARATUS AND METHOD FOR DIAGNOSING INTEGRATED CIRCUIT

(75) Inventor: Takahisa Hiraide, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 442 days.

(21) Appl. No.: 10/355,014

(22) Filed: Jan. 31, 2003

(65) Prior Publication Data

US 2003/0229838 A1  Dec. 11, 2003

(30) Foreign Application Priority Data

Jun. 11, 2002  (JP) .............................. 2002-170051

(51) Int. Cl.
  *G01R 31/3183* (2006.01)
  *G01R 31/40* (2006.01)
(52) U.S. Cl. ...................... 714/724; 714/738
(58) Field of Classification Search ............... 714/724, 714/728, 726, 733, 738, 732
See application file for complete search history.

(56) References Cited

U.S. PATENT DOCUMENTS

| 5,081,626 A | * | 1/1992 | Scott .......................... 714/732 |
| 5,301,199 A | | 4/1994 | Ikenaga et al. ............. 714/733 |
| 6,118,296 A | * | 9/2000 | Ozaki ......................... 326/16 |
| 6,557,129 B1 | * | 4/2003 | Rajski et al. ............... 714/729 |

| 2002/0124217 A1 | * | 9/2002 | Hiraide et al. ............... 714/726 |

FOREIGN PATENT DOCUMENTS

| JP | 63-286780 | 11/1988 |
| JP | 1-277782 | 11/1989 |
| JP | 5-249197 | 9/1993 |
| JP | 8-15382 | 1/1996 |
| JP | 8-220192 | 8/1996 |

OTHER PUBLICATIONS

Bookstein et al., Construction of Optimal Graphs for Bit-Vector Compression, Dec. 1989, Proceedings of the 13th annual international ACM SIGIR conference on Research and development in information retrieval, pp. 327-342.*

Notification of Reason(s) for Refusal issued Mar. 12, 2007 in corresponding Japanese Patent Application No. 2002-170051.

* cited by examiner

*Primary Examiner*—Cynthia Britt
*Assistant Examiner*—Dipakkumar Gandhi
(74) *Attorney, Agent, or Firm*—Staas & Halsey LLP

(57) ABSTRACT

An apparatus being able to not only detect a manufacturing defect of an integrated circuit but also specify a position at which the defect occurs even when outputs from scan paths are compressed and stored, or when the number of the scan paths is large. The apparatus has a pattern generator built in an integrated circuit to generate test patterns, a plurality of shift registers formed in parallel, into which the test patterns are shifted, and an output compressor for compressing a plurality of outputs shifted out from the shift registers with check bits of a Hamming code, and outputting them to the outside of the integrated circuit.

6 Claims, 8 Drawing Sheets

APPARATUS AND METHOD FOR DIAGNOSING INTEGRATED CIRCUIT

BACKGROUND OF THE INVENTION

1) Field of the Invention

The present invention relates to an apparatus and a method for making fault diagnosis to detect a manufacturing failure (fault) of an integrated circuit such as an LSI (Large Scale Integration) or the like and specify a position at which the fault occurs, and an integrated circuit having a function of accomplishing the fault diagnosis.

2) Description of the Related Art

Detection of a manufacturing failure of an integrated circuit such as an LSI is done by applying an appropriate signal value to an input pin of the LSI using a tester (ATE; Automatic Test Equipment), and comparing a signal value appearing at the output pin with an expected result. The signal value applied to the input pin and the expected value to be appeared at the output pin are together called a test pattern.

Defect occurring inside an LSI due to a manufacturing failure of the LSI is called fault. To verify all faults that may occur inside the LSI, a large number of test patterns are required. A rate of the number of faults that can be verified by a certain test pattern to the number of all assumptive faults that are assumed inside an LSI is called fault coverage, used as a scale when the quality of the test pattern is measured. When the LSI includes sequential circuit elements [flip-flop (F/F), latch and RAM (Random Access Memory)], complexity of creation of test patterns is greatly increased.

In LSIs, scan design is general. In a scan-designed LSI, a shift register (called a scan path) is formed with sequential circuit elements (F/Fs, mainly) inside the LSI, a desired value is shifted into the shift register in a test, and a value of the shift register is read out after a clock has been applied.

In such circuits, widely adopted is deterministic stored pattern test (hereinafter referred as DSPT). DSPT is made by storing test patterns generated by an automatic test pattern generator (hereinafter referred as an ATPG) in a tester (an ATE).

FIG. 6 is a diagram for illustrating a known scan design. FIG. 6 shows a concept of the scan design as a block diagram. In a scan-designed LSI, there are formed a plurality of scan paths (shift registers) which are paths for testing the LSI, as shown in FIG. 6. Each of the scan paths is formed with a plurality of F/Fs, each of which is a memory element. Test patterns are shifted into the scan paths from their ends (the left side in FIG. 6), and results of the test are outputted from the other ends (the right side in FIG. 6). Incidentally, FIG. 6 shows four scan paths, and each of the scan paths is formed by serially connecting eight F/Fs.

The number of sequential circuit elements included inside an LSI is extremely increased with the integration of LSIs increased. When setting and reading are repetitively carried out for each test pattern in all sequential circuit elements forming scan paths in the above DSPT, not only the test time increases but also a problem occurs that the memory capacity of the tester lacks due to an increase in quantity of the test data. Accordingly, execution of the test in DSPT becomes difficult. Particularly, shortage of the memory capacity of the tester caused by an increase in quantity of test data largely raises the test cost because the memory has to be increased or the tester has to be upgraded.

To solve the above problem, the recent trend is built-in self test (hereinafter referred as BIST). In BIST, patterns generated by a pseudo-random pattern generator 2 are applied to an internal circuit (scan paths) of an LSI, and output results from the internal circuit are verified and stored by an output verifier 7, as shown in FIG. 7. As the pseudo-random pattern generator 2 and the output verifier 7, there are often used linear feedback shift registers (hereinafter referred as LFSRs). Particularly, the output verifier 7 is called a multi-input signature register (hereinafter referred as MISR) since it compresses and stores output results as signatures. Incidentally, FIG. 7 is a diagram for illustrating a known BIST circuit FIG. 7 also shows eight scan paths between the pseudo-random pattern generator 2 and the output verifier 7. Each of the scan paths is formed by serially connecting four F/Fs.

The BIST circuit can generate a large number of test patterns within a short time because the pseudo-random pattern generator is mounted inside the LSI, thus there is no need to store input test patterns in an external tester. Results of the test are compressed and stored by the MISR, so that it is possible to greatly decrease the quantity of data to be loaded to the tester. Further, the BIST circuit can increase the speed of the shifting-in/shifting-out operation to the scan paths by increasing the number of the scan paths, thereby shortening the test time.

Although the above problem with the DSPT can be improved by employing BIST as above, there are still some problems.

Namely, a problem with BIST is the quality of the test (fault coverage) because a pseudo-random pattern is used therein. To increase the fault coverage, it is necessary to apply DSPT as an additional test, or insert a test point, which can improve the controllability and observability, into the circuit inside the LSI.

In BIST, output data are compressed and stored in an MISR. When the MISR captures an indeterminate value (X value) even once, all registers in the MISR become the indeterminate state because of its structure, and values held in the registers are destroyed, which renders the test impossible.

Generally, sequential circuit elements including a RAM inside an LST are in the indeterminate state when the power supply is turned on. For this, it is necessary to beforehand apply a pattern to initialize these sequential circuit elements or take some measures in the circuit to prevent propagation of the indeterminate state to the MISR. Additionally, it is necessary to prevent occurrence of conflict or the floating state of the bus caused by a random pattern when the bus is designed, for example. These severe constraints in design are placed on the designer when the BIST is applied to a practical circuit. Further, there is another problem that area overhead of the circuit or performance degradation occurs because of an additional circuit for BIST and insertion of a test point.

Inventors of this application have proposed a technique disclosed in Japanese Patent Application No. 2000-372231, which can solve the above problems with DSPT and BIST, shorten the test time, decrease the data quantity, and accomplish a high-quality test (test having a high fault coverage). FIG. 8 (block diagram) shows a structure of a test circuit applied this technique.

A test circuit shown in FIG. 8 is based on a BIST circuit similar to that shown in FIG. 7 on an LSI, and a pattern modifier 4 and a mask 5 are added to the BIST circuit. Patterns generated by the pseudo-random pattern generator (LFSR) 2 are modified into patterns equivalent to ones generated by the ATPG, and shifted into the scan paths. After a test clock is applied, outputs from the scan paths are compressed by and stored in the MISR in the output verifier 7 through the mask 5. At this time, an indeterminate value (X value) in the outputs is masked by the mask 5. Incidentally, eight scan paths are shown between the pattern modifier 4 and the mask 5, and each of the scan paths is formed by serially connecting four F/Fs in FIG. 8.

When patterns generated by an ATPG are shifted into scan paths and a test is made, the number of F/Fs to which values (1 or 0) explicitly set on the basis of the patterns is extremely small (several percent) among all F/Fs. In the test circuit shown in FIG. 8, only values to be explicitly set to F/Fs as above are given to the pattern modifier 4 using a control signal from an external tester, and pseudo-random patterns from the pseudo-random pattern generator 2 are modified by the pattern modifier 4 into high-quality patterns equivalent to ones generated by the ATPG. An interminate value is prevented from being captured into the MISR by the mask 5, whereby the designer can do designing in a way to readily and certainly satisfy one of design constrains in BIST, which can largely reduce the burden on the designer.

The LSI testing method of compressing output results and storing them in the MISR as is made in the BIST circuit shown in FIG. 7 or the test circuit shown in FIG. 8 is aimed mainly to judge the quality of an LSI under test. In practical LSI manufacturing, it sometimes becomes necessary to examine a cause of a failure in an LSI that has been judged to have the failure in order to solve a problem in the LSI manufacturing process or improve the yield rate. In such case, it is necessary to specify where the defect exists inside the LSI.

Generally, specifying a position of a fault on the basis of a test pattern given by a tester and information on a portion where an observed value of the tester disagrees with an expected value is called fault diagnosis. Since it is possible to observe outputs of each pattern in DSPT, the fault diagnosis is relatively easy. A fault that can be detected by each pattern and a position (F/F) at which the fault is detected can be known in fault simulation, so that a candidate fault can be narrowed down on the basis of the disagreement information of the tester.

On the contrary, the BIST circuit shown in FIG. 7 or the test circuit shown in FIG. 8 compresses output results and stores them in the MISR of the output verifier 7, and reads out values in the MISR after the test is completed, so that the fault diagnosis is difficult. Namely, even if presence of a fault can be detected, it is impossible to specify a position of the fault because the output results are compressed. Additionally, the number of scan paths is increased to increase the speed of the test in the test such as BIST or the like, so that outputs of all scan paths cannot be observed at external pins because of limitation of the number of pins of an LSI. In other words, the fault diagnosis is impossible.

SUMMARY OF THE INVENTION

In the light of the above problems, an object of the present invention is to provide a technique, which can not only detect a manufacturing failure (fault) of an integrated circuit but also specify a position at which the failure occurs even when outputs from scan paths are compressed and stored, or the number of scan paths is large.

The present invention therefore provides a diagnosing apparatus for an integrated circuit comprising a pattern generator built in an integrated circuit to generate test patterns, a plurality of shift registers formed in parallel with sequential circuit elements inside the integrated circuit, the test patterns generated by the pattern generator being shifted into the shift registers, respectively, and an output compressor for compressing a plurality of outputs shifted out from the shift registers with check bits of a Hamming code, and outputting the compressed outputs as a compressed value to the outside of the integrated circuit.

The diagnosing apparatus may further comprise diagnosing means for comparing an output expected value beforehand obtained with the compressed value from the output compressor to make fault diagnosis. When the diagnosing means diagnoses as a result of the comparison that a fault occurs at one position, the diagnosing means may specify a shift register in which the fault exists.

The present invention further provides a diagnosing method for an integrated circuit comprising the steps of generating test patterns by a pattern generator built in an integrated circuit, shifting the test patterns generated by the pattern generator into a plurality of shift registers formed in parallel with sequential circuit elements inside the integrated circuit, compressing a plurality of outputs shifted out from the plural shift registers with check bits of a Hamming code, and outputting the compressed outputs as a compressed value to the outside of the integrated circuit, and comparing an output expected value beforehand obtained with the compressed value from the integrated circuit to make fault diagnosis.

The present invention still further provides an integrated circuit, in which the above pattern generator, a plurality of the shift registers and the output compressor are built.

The present invention still further provides a diagnosing apparatus for an integrated circuit comprising a pattern generator, a plurality of shift registers both similar to those described above, along with at least one EOR (exclusive OR) tree circuit for compressing a plurality of outputs shifted out from the shift registers, and outputting the compressed outputs as a compressed value to the outside of the integrated circuit, and a control circuit for enabling one of the plurality of outputs to be inputted to the EOR tree circuit.

The above diagnosing apparatus may further comprise a diagnosing means for comparing an output expected value beforehand obtained with the compressed value from the EOR tree circuit to make fault diagnosis. The control circuit may enable the plurality of outputs one by one, the EOR tree circuit may compress outputs enabled by the control circuit, and successively output the compressed outputs as the compressed value to the outside of the integrated circuit, and the diagnosing means may make the fault diagnosis on the shift registers one by one on the basis of the compressed value from the EOR tree circuit to specify a shift register in which the fault exists.

The present invention still further provides a diagnosing method for an integrated circuit comprising the steps of generating test patterns by a pattern generator built in an integrated circuit, shifting the test patterns generated by the pattern generator into a plurality of shift registers formed in parallel with sequential circuit elements inside the integrated circuit, enabling a plurality of outputs shifted out from the shift registers one by one, compressing the enabled outputs by an EOR (exclusive OR) tree circuit, and successively outputting the compressed outputs as a compressed value to the outside of the integrated circuit, and comparing an output expected value beforehand obtained with the compressed value from the EOR tree circuit to make fault diagnosis.

The present invention still further provides an integrated circuit, in which a pattern generator, shift registers, an EOR (exclusive OR) tree circuit and a control circuit similar to those described above are built.

According to the diagnosing apparatus and method for an integrated circuit and the integrated circuit of this invention, a plurality of outputs shifted out from a plurality of shift registers are compressed with check bits of a Hamming code, and outputted to the outside. Therefore, it is possible to observe information on a number of scan paths at a small number of external output pins, and accomplish diagnosis on an LSI under test such as BIST or the like with small circuit overhead. Although it is necessary to compare an expected value by a tester for each test pattern when diagnosis is made, diagnosis at a higher speed then DSPT becomes possible because information on a number of scan paths is compressed and encoded. Even when outputs from the scan paths are compressed and stored, or even when the number of the scan paths is large, it is possible to not only detect a manufacturing failure (fault) of an integrated-circuit but also specify a position at which the failure occurs.

Since a plurality of outputs shifted out from a plurality of shift registers are enabled one by one, and the enabled outputs are compressed by the EOR (exclusive OR) tree circuit and successively outputted to the outside, it is possible to accurately specify all scan paths in which faults exist when fault diagnosis is made on an LSI under test such as BIST OR the like. Even when a number of faults concurrently exist because a new manufacturing process is started, accurate, certain fault diagnosis is possible.

At this time, outputs from shift registers corresponding to patterns of pattern numbers in a predetermined range generated by the pattern generator are enabled, and the fault diagnosis is made. Whereby, it is possible to narrow down a pattern number where a fault occurs to specify a position of the fault in the scan path.

Test patterns generated by the pattern generator are modified by the pattern modifier and inputted to a plurality of shift registers (scan path). It is thereby possible to increase the number of the scan paths to decrease the number of the stages of the scan paths, thus largely shorten the test time for the integrated circuit. It is also possible to solve the problems with DSPT and BIST, and generate test patterns which provide advantages of the both and enable a high-quality test within a short time. At this time, only meaningful data (information on F/Fs required to be set values) is supplied from the tester (external input) and modified, which allows a large decrease in quality of the data to be stored in the tester. Therefore, a high-quality test becomes possible without imposing server design rules on the designer and without an expensive tester.

An indeterminate value in outputs from a plurality of shift registers formed with sequential circuit elements inside the integrated circuit is masked, and a masked output result is verified by the output verifier. It is thereby possible to prevent the compressed result from being ruined by the indeterminate state even if the output results from the sequential circuit elements are compressed and read out to the outside.

DESCRIPTION OF THE PREFERRED EMBODIMENTS

Hereinafter, description will be made of embodiments of this invention with reference to the drawings.

1 Description of First Embodiment

For fault diagnosis, agreement/disagreement information (information on whether a scan path output agrees with an expected value for each test pattern) for each test pattern is necessary, like DSPT. Since a scan path output is not compared with an expected value for each test pattern in BIST, it is necessary to read values of F/Fs for each test pattern to the outside. However, the number of inside parallel scan paths is increased for the purpose of a high-speed test in BIST, so that external output pins in number equal to all scan paths cannot be prepared because of limitation of the number of input/output pins of an LSI. Accordingly, some measures are necessary to compress information of a number of scan paths and observe it at a small number of external output pins. A first embodiment of this invention provides such measures.

Figure 1:
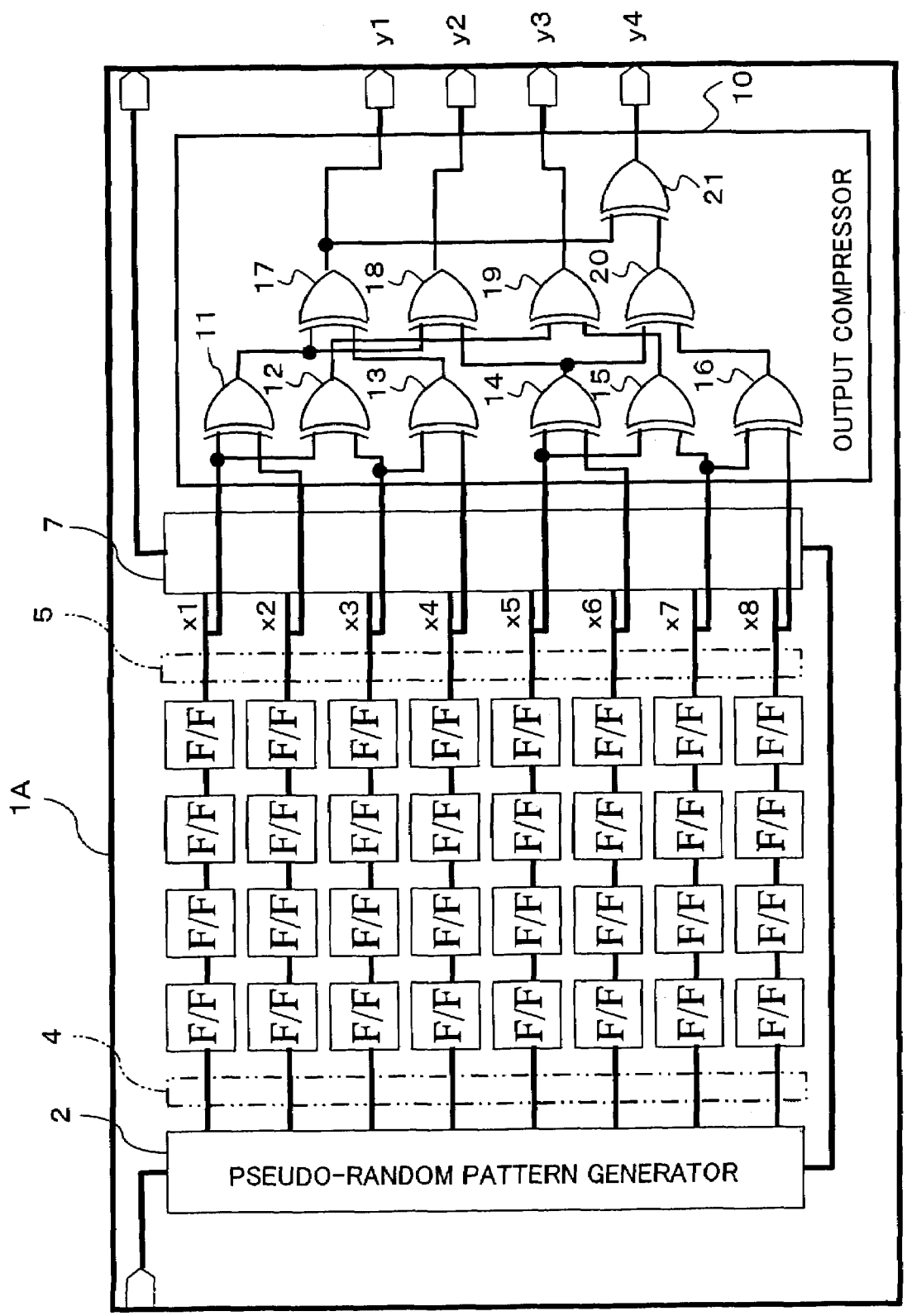
FIG. 1 is a block diagram showing a structure of a diagnosing apparatus for an integrated circuit according to a first embodiment of this invention.

FIG. 1 is a block diagram showing a structure of a diagnosing apparatus for an integrated circuit according to the first embodiment of this invention. The diagnosing apparatus according to the first embodiment comprises a pseudo-random pattern generator (pattern generator, LFSR) 2, a plurality of scan paths, an output verifier (MISR) 7, and an output compressor 10, as shown in FIG. 1. The diagnosing apparatus is built in an LSI 1A that is an integrated circuit to be tested.

The LSI 1A includes a plurality of F/Fs (sequential circuit elements). In the LSI 1A, a plurality of scan paths (shift registers) are formed in parallel with the F/Fs. In the example shown in FIG. 1, eight scan paths are formed in parallel, and each of the scan paths is formed by serially connecting four F/Fs.

In the diagnosing apparatus according to the first embodiment, patterns generated by the pseudo-random pattern generator 2 are shifted into the scan paths, and output results of the scan paths are compressed and stored by the output verifier 7. The output verifier 7 is formed with a plurality of exclusive OR (EOR) circuits and a plurality of registers. The output verifier 7 compresses (encodes) output results from the scan paths as signatures and stores them, then finally outputs the output results for predetermined test patterns as a value encoded into eight bits.

The output compressor 10 is formed with exclusive OR circuits (EOR circuits) 11 through 21, as shown in FIG. 1. The output compressor 10 compresses a plurality of outputs (8-bit data in FIG. 1) shifted out from the plural scan paths using check bits (four bits in FIG. 1) of a Hamming code.

Figure 2:
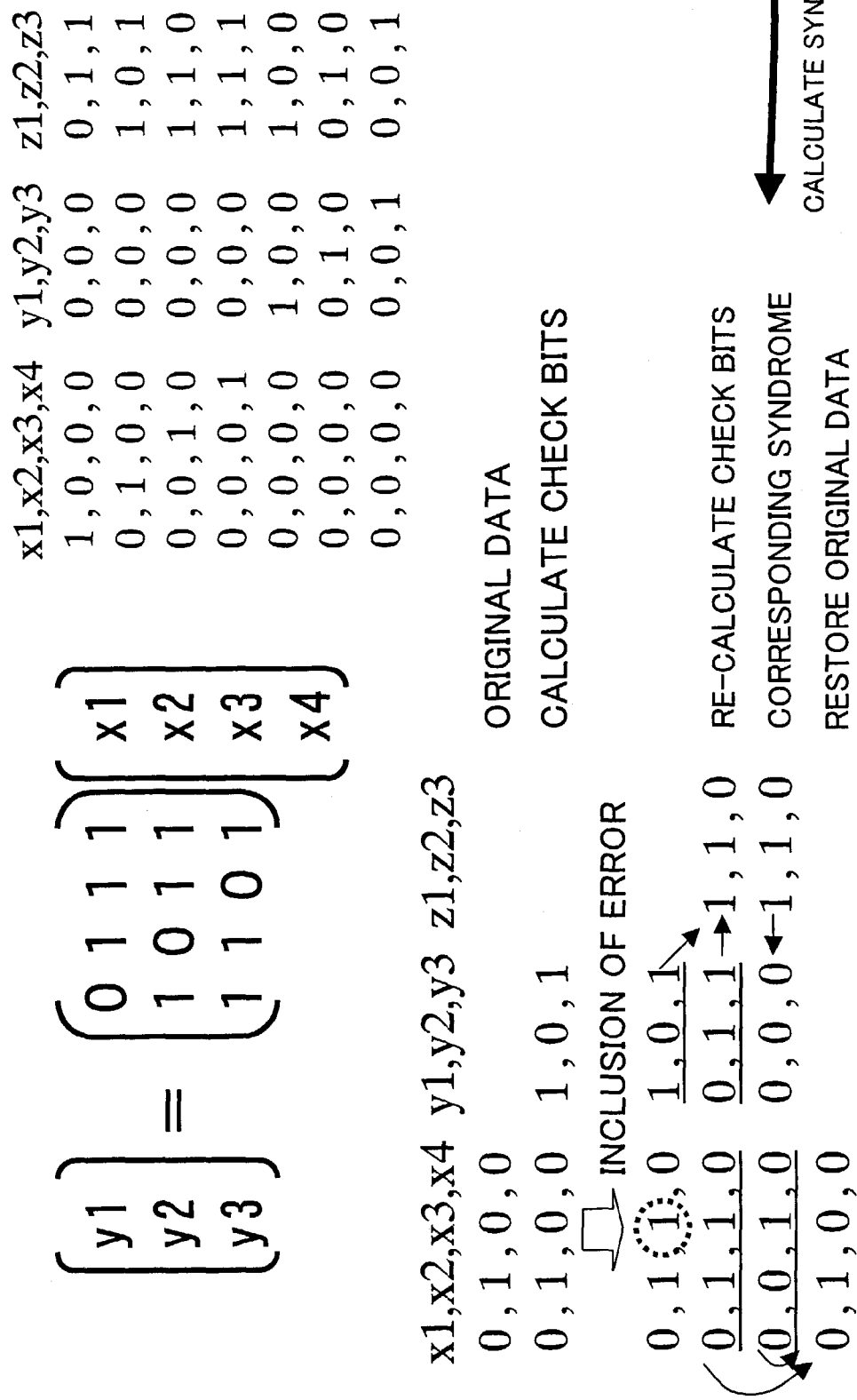
FIG. 2 is a diagram for illustrating a compressing method (an example of error correction using a Hamming code) with check bits of a Hamming code according to the first embodiment.

Namely, the output compressor 10 corresponds to check bits of a Hamming code, formed with the EOR circuits 11 through 21 realizing check bits of a Hamming code. Hamming code is a family of error correction codes, which can correct an error of one bit. By adding check bits to actual information bits, error correction can be done in a Hamming code. When the information bits are four bits (x1,x2,x3,x4), the check bits require three bits (y1,y2,y3). FIG. 2 shows an example of error correction in this case. FIG. 2 is a diagram for illustrating a compressing method (an example of error correction using a Hamming code) using check bits of a Hamming code according to the first embodiment of this invention.

In the example shown in FIG. 2, the information bits are four bits (x1,x2,x3,x4) and the check bits are three bits (y1,y2,y3), as described above. The check bits (y1,y2,y3) are calculated from the information bits (x1,x2,x3,x4) on the basis of an expression shown in FIG. 2. In this case, a syndrome is of three bits (z1, z2, z3), and an error vector corresponding to the syndrome is beforehand given as shown in FIG. 2.

If the original data is (0,1,0,0) at this time, (1,0,1) should be obtained as the check bits. Namely, when (0,1,0,0) are expected as scan path outputs for certain test patterns, (1,0,1) should be outputted as check bit outputs from the output compressor 10, so that (1,0,1) are beforehand obtained as an output expected value.

Assuming that when (0,1,0,0) are expected as scan path outputs, an error happens therein due to a fault, x3 becomes, for example, "1", and (0,1,1,0) are obtained as the scan path outputs. In this case, (0,1,1) are obtained as the check bits (outputs of the output compressor 10), an exclusive OR (EOR) is calculated from the check bits (0,1,1) and the output expected value (1,0,1), whereby a syndrome (1,1,0) is obtained.

An error vector (x1,x2,x3,x4,y1,y2,y3) corresponding to the obtained syndrome (1,1,0) is (0,0,1,0,0,0,0) as shown in FIG. 2. In a Hamming code, an exclusive OR of (x1,x2,x3,x4) of the error vector and the scan path outputs (0,1,1,0) is calculated, whereby original data can be restored.

According to the first embodiment, there is no need to restore the original data. When the syndrome is calculated, a bit of the error mixing therein, that is, a scan path in which a fault exists, is specified.

In the example shown in FIG. 1, the information bits are eight bits (x1,x2, . . . ,x8). In this case, the method described above with reference to FIG. 2 is expanded and applied since the check bits becomes four bits (y1,y2,y3,y4). Namely, scan path outputs (x1,x2, . . . ,x8) of eight bits are compressed into check bit data (y1,y2,y3,y4) of four bits of a Hamming code of four bits by the output compressor 10 (EOR circuits 11 through 21), and outputted to the outside of the LSI 1A.

According to the first embodiment, there is provided a tester (diagnosing means) not shown, to which outputs [check bit data (y1,y2,y3,y4)] from the output compressor 10 are inputted. The tester beforehand holds therein check bit data to be obtained when no fault (error) occurs as an output expected value. The tester compares the output expected value with outputs (check bit data) from the output compressor 10, and makes fault diagnosis.

In concrete, an exclusive OR is calculated from the output expected value and the check bit data from the output compressor 10 to obtain a syndrome, and a fault position is determined on the basis of the syndrome, as described above. When no fault exists, the output expected value agrees with the check bit data from the output compressor 10, and each bit of the syndrome becomes "0". When a fault exists in one of a plurality of the scan paths, the output expected value disagrees with the check bit data from the output compressor 10, and an error of one bit in scan path outputs (x1,x2, . . . ,x8) of eight bits can be specified on the basis of an error vector corresponding to the obtained syndrome. Namely, it is possible to specify one scan path where the fault occurs (fault position).

When faults concurrently occur in two or three scan paths, a result of outputs of the output compressor 10 disagrees with an expected value of the tester, as does when a fault occurs in one scan path. However, it is not always that the fault occurs in a scan path obtained with the syndrome, thus it is impossible to specify the fault position (a scan path in which the fault exists). In this case, it is only possible to indicate presence of the fault. When faults concurrently occur at not less than four positions, there is a case where a result of outputs of the output compressor 10 agrees with an expected value of the tester even though the faults exist, thus presence/absence of a fault cannot be sometimes accurately indicated.

According to the first embodiment of this invention, a plurality of outputs shifted out from a plurality of scan paths are compressed and encoded into check bits of a Hamming code, then outputted to the outside of the LSI 1A. It is thereby possible to observe information on a number of scan paths at a small number of external output pins (four in the example in FIG. 1). Accordingly, diagnosis of the LSI 1A under test such as BIST or the like can be made with small circuit overhead.

In fault diagnosis, it is necessary to compare expected values by a tester for each test pattern. However, information on a number of scan paths is compressed and encoded, so that diagnosis higher than DSPT becomes possible. Even when outputs from scan paths are compressed and stored, or even when the number of scan paths is large, it is possible to not only detect a manufacturing defect (fault) of the LSI 1A but also specify a position of a fault (scan path) if the fault occurs at one position. According to the first embodiment, when faults occur in two or three scan paths, only presence of the faults is indicated. However, even only indicating presence of faults is considered to be greatly effective to the LSI 1A in the mass production stage.

Figure 8:
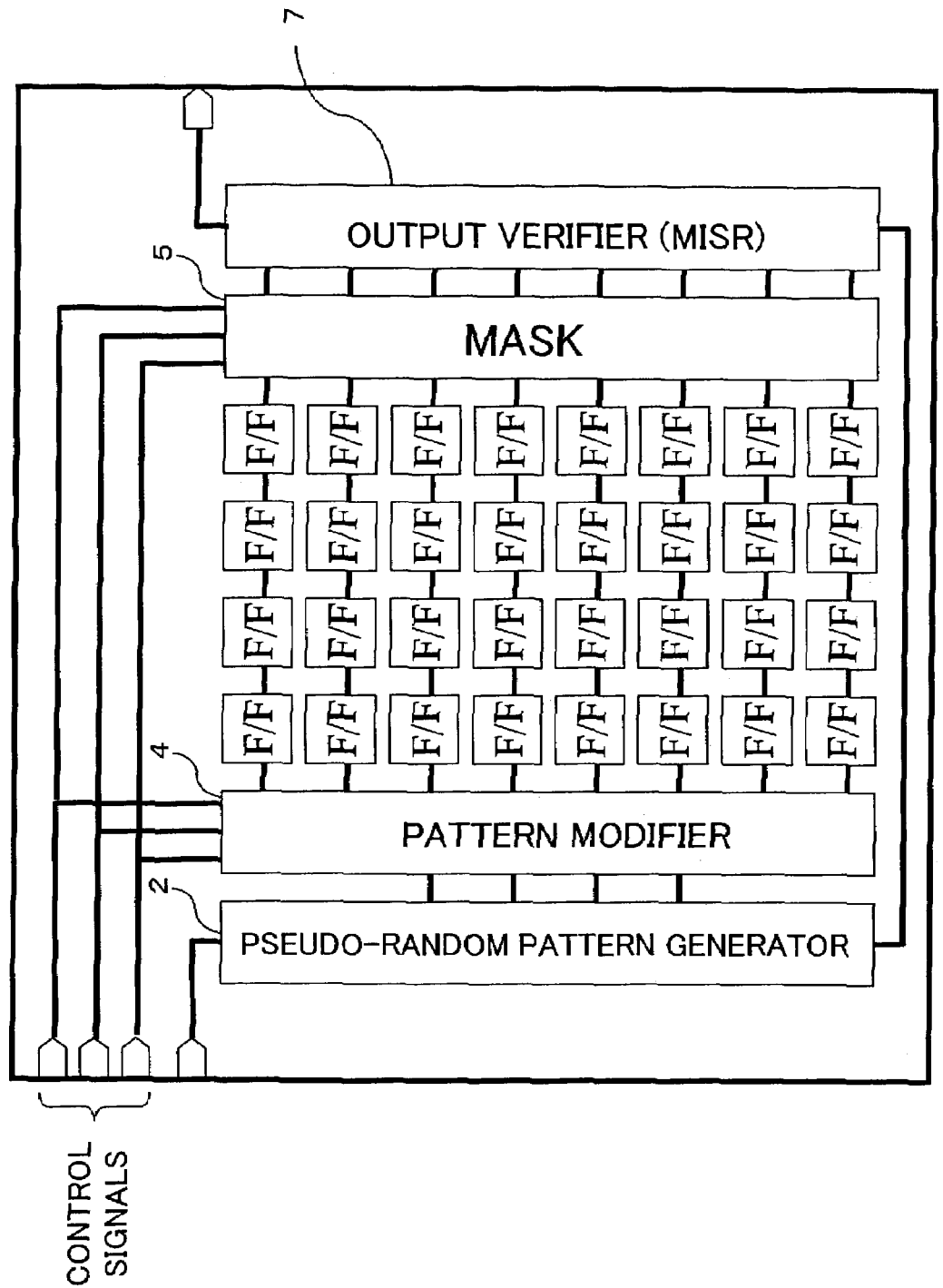
FIG. 8 is a block diagram showing a structure of a test circuit for an integrated circuit with a pattern modifier and a mask.

As shown by chain double-dashed line in FIG. 1, a pattern modifier 4 which modifies test patterns generated by the pseudo-random pattern generator 2 according to an external input and inputs them into the plural scan paths (shift registers), and a mask 5 which masks an indeterminate value (X value) in outputs of the plural scan paths and outputs them to the output verifier 7, then to the output compressor 10 may be also built in the LSI 1A, like the testing apparatus described above with reference to FIG. 8.

At this time, test patterns generated by the pseudo-random pattern generator 2 are inputted to the pattern modifier 4. A control signal from the tester (not shown) is inputted to the pattern modifier 4 through a control input pin or the like. The pattern modifier 4 modifies only values of F/Fs in which values thereof are required to be set according to the control signal, and inputs and sets the values to the leading F/Fs of relevant scan paths.

The mask 5 masks an indeterminate value (X value) among values of the last F/Fs of the scan paths according to the control signal inputted through the control input pin or the like to convert the indeterminate state to the determinate state, then inputs values of the last F/Fs of the scan paths to the output verifier 7 and the output compressor 10.

By modifying test patterns generated by the pseudo-random pattern generator 2 by the pattern modifier 4 and inputting them into a plurality of scan paths, it becomes possible to increase the number of the scan paths to decrease the number of stages of the scan paths (the number of F/Fs in each scan path), thereby decreasing the test time for the LSI 1A.

Additionally, it is also possible to solve the problems with DSPT and BIST, and generate test patterns within a short time which have advantages of the both and enable a high-quality test. At that time, only meaningful data (information on an F/F to which a value is required to be set) is supplied from the tester (external input) and modified, so that the quantity of data to be stored in the tester can be largely decreased. Accordingly, a high-quality test becomes possible without imposing severe design rules on the designer and without an expensive tester.

Further, the mask 5 masks an indeterminate value (X value) in outputs from the plural scan paths formed with F/Fs inside the LSI 1A, and the output verifier 7 verifies the masked output results, whereby a result of compression is not ruined by the indeterminate value even if the output results from the F/Fs are compressed and read out to the outside.

2 Description of Second Embodiment

When a plurality of faults concurrently occur, it is impossible to specify positions of the faults in the above first embodiment. This easily occurs when a new manufacturing process is started, thus necessity of fault diagnosis is large. According to second and third embodiments, it becomes possible to accurately specify all scan paths in which faults occur as necessary.

Figure 3:
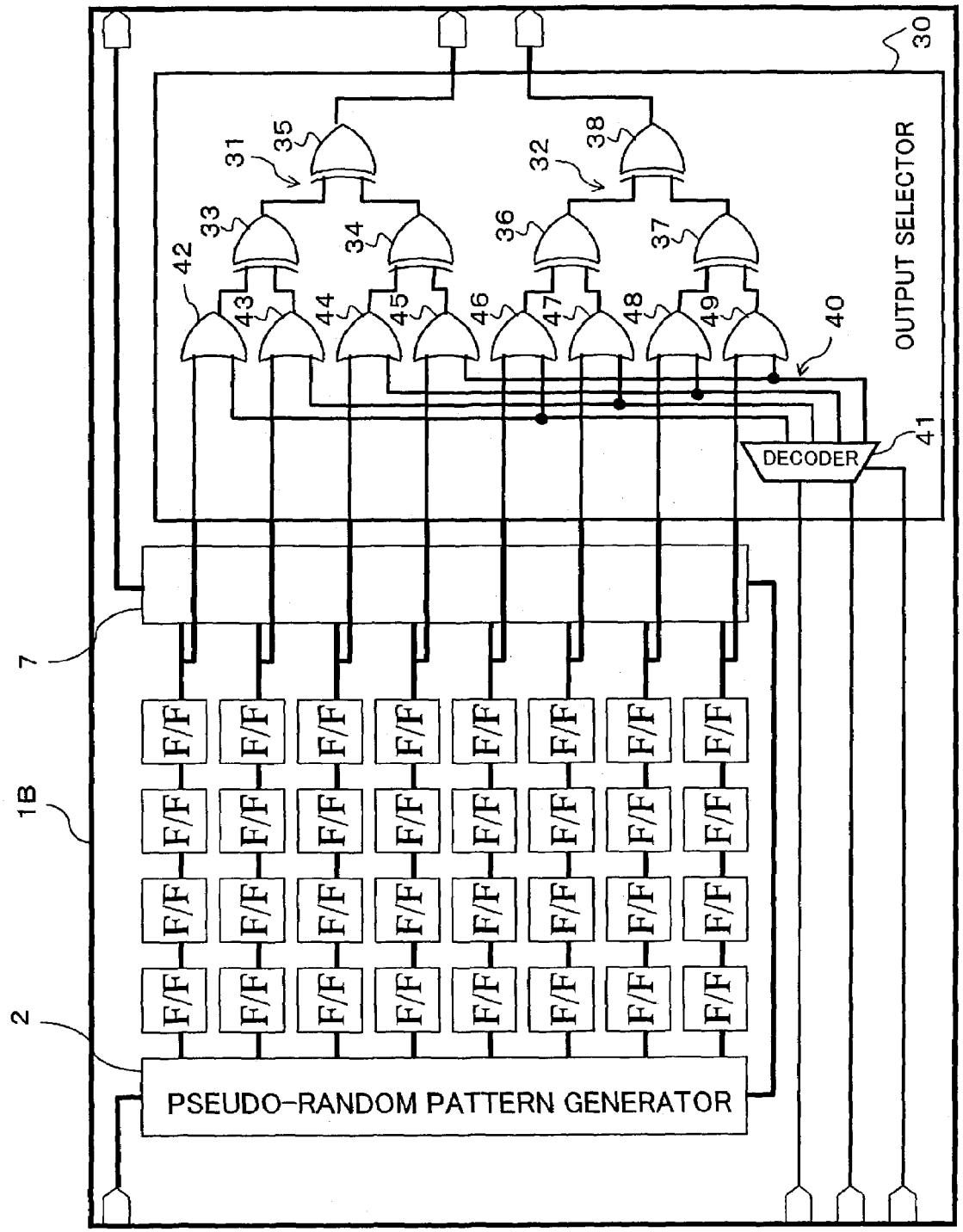
FIG. 3 is a block diagram showing a structure of a diagnosing apparatus for an integrated circuit according to a second embodiment of this invention.

FIG. 3 is a block diagram showing a structure of a diagnosing apparatus for an integrated circuit according to the second embodiment of this invention. As shown in FIG. 3, the diagnosing apparatus according to the second embodiment comprises a pseudo-random pattern generator 2, a plurality of scan paths, and an output verifier 7 similar to those according to the first embodiment, along with an output selector 30 instead of the output compressor 10. The diagnosing apparatus is built in an LSI 1B that is an integrated circuit to be tested.

Like the LSI 1A according to the first embodiment, the LSI 1B includes a plurality of F/Fs (sequential circuit elements). In the LSI 1B, these F/Fs form a plurality of scan paths (shift registers) in parallel. In an example shown in FIG. 3, eight scan paths are formed in parallel, and each of the scan paths is formed by serially connecting four F/Fs.

In the diagnosing apparatus according to the second embodiment, patterns generated by the pseudo-random pattern generator 2 are shifted into the scan paths, and output results from the scan paths are compressed and stored by the output verifier 7, as well. The output verifier 7 is formed with a plurality of EOR circuits and a plurality of registers. The output verifier 7 compresses (encodes) output results from the scan paths and stores them, and finally outputs the output results for predetermined test patterns as an eight-bit encoded value.

The output selector 30 comprises two EOR (exclusive OR) tree circuits 31 and 32, and a control circuit 40, as shown in FIG. 3.

The EOR tree circuit 31 is formed with three exclusive OR circuits (EOR circuits) 33, 34 and 35, which compresses outputs shifted out from upper four scan paths shown in FIG. 3, and outputs them to the outside of the LSI 1B. Similarly, the EOR tree circuit 32 is formed with three exclusive OR circuits (EOR circuits) 36, 37 and 38, which compresses outputs shifted out from lower four scan paths shown in FIG. 3, and outputs them to the outside of the LSI 1B. The control circuit 40 comprises a decoder 41, and eight OR circuits (logical sum circuits) 42 through 49. The control circuit 40 enables one of plural outputs (four outputs, here) to be inputted to each of the EOR tree circuits 31 and 32.

The OR circuits 42 and 43 input logical sums of outputs of the first and second scan paths from the top shown in FIG. 3 and selection signals from the decoder 41 to two input terminals of the EOR circuit 33, respectively. Similarly, the OR circuits 44 and 45 input logical sums of outputs of the third and fourth scan paths from the top shown in FIG. 3 and selection signals from the decoder 41 to two input terminals of the EOR circuit 34, respectively. The OR circuits 46 and 47 input logical sums of outputs of the fifth and sixth scan paths from the top shown in FIG. 3 and selection signals from the decoder 41 to two input terminals of the EOR circuit 36, respectively. The OR circuits 48 and 49 input logical sums of outputs of the seventh and eighths scan paths from the top shown in FIG. 3 and selection signals from the decoder 41 to two input terminals of the EOR circuit 37, respectively.

The decoder 41 gives selection signals to the OR circuits 42 through 49 according to a control signal fed from the outside of the LSI 1B in order to input only outputs of scan paths to be enabled to the EOR tree circuits 31 and 32.

According to the second embodiment, the decoder 41 switches only one of selection signals to be inputted to the upper four OR circuits 42 through 45 from "1" to "0" and switches only one of selection signals to be inputted to the lower four OR circuits 46 through 49 from "1" to "0" according to the control signal from outside of LSI 1B, in order to enable only one of outputs of the upper four scan paths to be inputted to the EOR tree circuit 31 and to enable only one of outputs of the lower four scan paths to be inputted to the EOR tree circuit 32. The OR circuits 42, 43, 44 or 45, and 46, 47, 48 or 49 inputted selection signals "0" from the decoder 41 allow outputs of scan paths inputted to these OR circuits to pass therethrough, and input outputs of these scan paths to the EOR tree circuits 31 and 32. Outputs of the OR circuits 42 through 49 to which selection signals "1" have been inputted always become "1", so that outputs of the relevant scan paths cannot pass through these OR circuits.

According to the second embodiment, two outputs among outputs of the eight scan paths are selected and enabled, and outputted to the outside of the LSI 1B from two external output pins through the EOR tree circuits 31 and 32 in one test. Namely, when the test is repeated four times, the test on all eight scan paths can be completed.

According to the second embodiment, a tester (diagnosing means) not shown is provided, to which outputs from the output selector 30 are inputted. Output expected values that should be obtained when no fault (error) occurs are beforehand stored in the tester, and compares the expected values with outputs from the output selector 30 to make fault diagnosis.

In the second embodiment, when diagnosis is made on the LSI 1B to which a test such as BIST or the like has been applied, the control circuit 40 enables outputs of scan paths to be inputted to the EOR tree circuits 31 and 32 one by one with or without concurrent faults, with the above structure. Each of the EOR tree circuits 31 and 32 compresses outputs that have been enabled by the control circuit 40, and successively outputs them to the outside of the LSI 1B. The above tester compares an expected value with outputs from the EOR tree circuits 31 and 32 to make fault diagnosis, and specifies a scan path whose output does not agree with the output expected value as a scan path in which a fault occurs.

The above process is repeated plural times (four times in the LSI 1B according to the second embodiment shown in FIG. 3) to diagnose all scan paths, thereby to specify positions of all faults (scan paths in which the faults exist). In more detail, in the first test, the selection signals of the decoder 41 are so set as to enable only the first scan paths connected to the EOR tree circuits 31 and 32, and a test is made on the first scan paths. A scan path in which a fault exists is specified on the basis of disagreement information of the tester for each test pattern.

At this time, a group to which that scan path belongs (a group of the EOR tree circuit 31 or a group of the EOR tree circuit 32) is specified on the basis of disagreement information from either one of two external output pins provided correspondingly to the EOR tree circuits 31 and 32. Further, since it is recognized that the first scan path in each group is enabled by the selection signal from the decoder 41, a scan path in which a fault exists can be specified.

Similar test is repeated n times (n=4 in the second embodiment) to test up to the n-th scan path connected to each of the EOR tree circuits 31 and 32, so that all scan paths in each of which a fault exists can be specified.

It should be noted that it is necessary to recalculate the output expected values used in the test carried out n times according to a setting of the mask for diagnosis.

According to the second embodiment, outputs to be inputted to each of the EOR tree circuit 31 and 32 from the plural scan paths are enabled one by one by the control circuit 40, and the enabled outputs are compressed by each of the EOR tree circuit 31 and 32, and successively outputted to the outside of the LSI 1B. It is thereby possible to accurately specify all scan paths in which faults exist when fault diagnosis is made on an LSI under test such as BIST or the like. Accordingly, even if a plurality of faults concurrently exist because a new manufacturing process is started, accurate, certain fault diagnosis is possible.

3 Description of Third Embodiment

Figure 4:
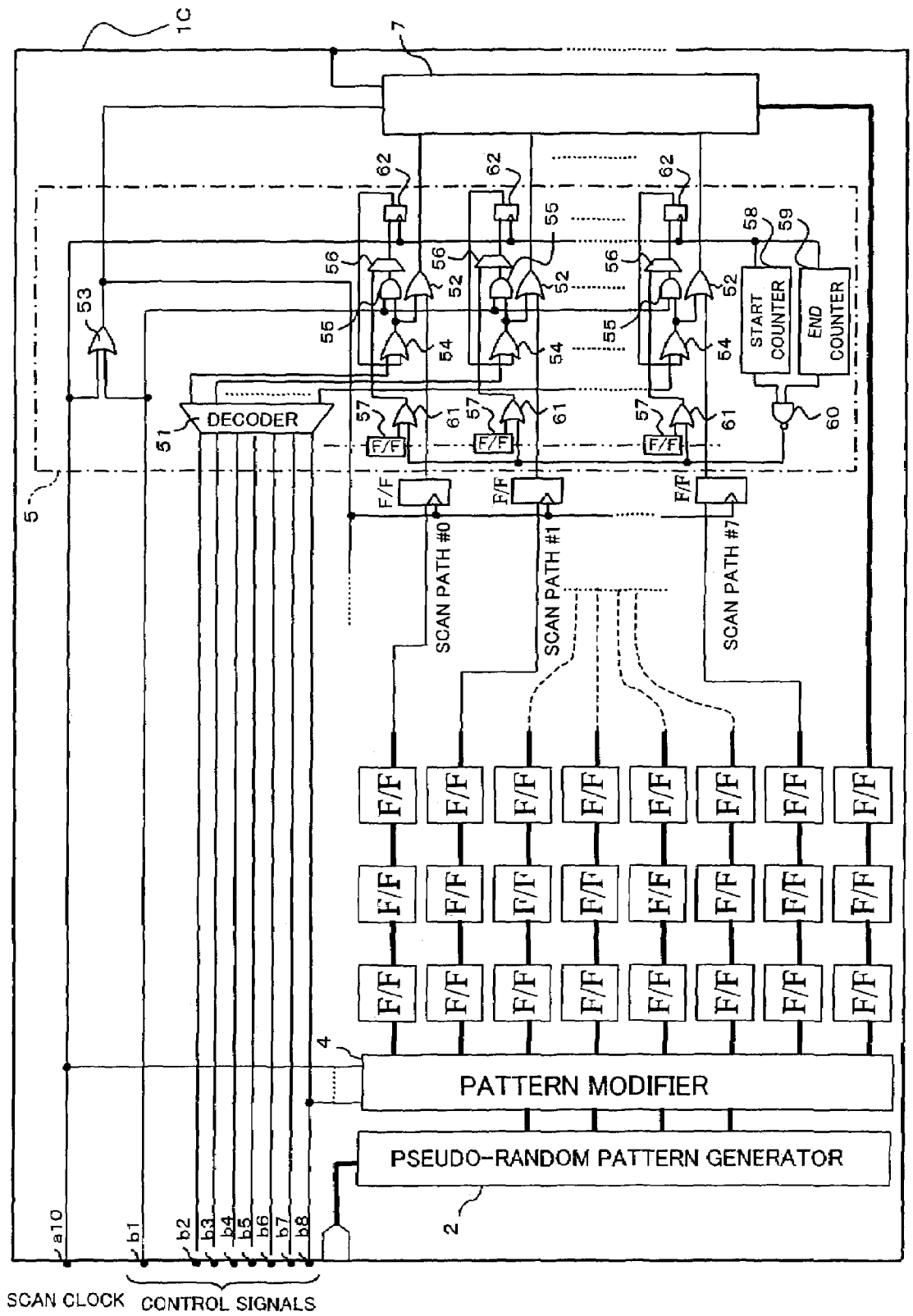
FIG. 4 is a block diagram showing a structure of a diagnosing apparatus for an integrated circuit according to a third embodiment of this invention.

FIG. 4 is a block diagram showing a structure of a diagnosing apparatus for an integrated circuit according to a third embodiment of this invention. As shown in FIG. 4, the diagnosing apparatus according to the third embodiment comprises a pseudo-random pattern generator (LFSR) 2, a plurality of scan paths (shift registers) and an output verifier (MISR) 7 similar to those according to the first or second embodiment, along with a pattern modifier 4 similar to that according to the first embodiment between the pseudo-random pattern generator 2 and the plural scan paths, and a mask 5 similar to that according to the first embodiment between the plural scan paths and the output verifier 7. The diagnosing apparatus is built in an LSI 1C that is an integrated circuit to be tested.

Like the LSI 1A according to the first embodiment, the LSI 1C includes a plurality of F/Fs (sequential circuit elements). In the LSI 1C, the F/Fs form a plurality of scan paths (shift registers) in parallel. In the example shown in FIG. 4, eight scan paths are formed in parallel, and each of the scan paths is formed by serially connecting four F/Fs.

In the diagnosing apparatus according to the third embodiment, test patterns generated by the pseudo-random pattern generator 2 are inputted to the pattern modifier 4. A control signal is inputted to the pattern modifier 4 from a tester (not shown) through a control input pin or the like. The pattern modifier 4 modifies only values for F/Fs to which the values are required to be set, and inputs and sets the values to the leading F/Fs of the scan paths.

The test patterns modified as above are shifted into the scan paths, and output results from the scan paths are inputted to the mask 5. The mask 5 masks an indeterminate value (X value) among values of the last F/Fs of the scan paths according to a control signal inputted from the control input pin or the like to convert the indeterminate state to the determinate state. Then, the values of the last F/Fs of the scan paths are inputted to the output verifier 7, and compressed by the output verifier 7 and stored therein. The output verifier 7 is formed with a plurality of EOR circuits and a plurality of registers, as described above. The output verifier 7 compresses (encodes) output results from the scan paths as signatures and stores them therein, then finally outputs them as a value encoded into eight bits.

The mask 5 is provided with a decoder 51, logical sum circuits (OR circuits) 52, 53 and 54, logical product circuits (AND circuits) 55 and flip-flops (F/Fs) 62 in order to mask an indeterminate value (X value) in outputs of the plural scan paths. To the mask 5 inputted are control signals through eight control input pins (b1 through b8), and outputs from the last F/Fs of eight scan paths #0 through #7.

The mask 5 controls a shift clock to the output verifier (and the pseudo-random pattern generator 2) and a shift clock to the F/Fs on the scan paths. When masking the indeterminate state, the shift clock to the F/Fs on the scan paths and the output verifier 7 (and the pseudo-random pattern generator 2) is suppressed, but only the shift clock to F/Fs 62 in the following stage of the last F/Fs on the scan paths is applied. Each of the F/Fs 62 holds an inversion state independently of the last F/F on the scan path. Such structure slightly increases overhead of the circuit, but makes it possible to separate the output verifier 7 from the scan paths #0 through #7 and easily modularlizes them, which allows re-ordering process of optimally changing the order of the scan F/Fs at the time of layout in which physical placement and routing are performed.

The mask 5 enables a masking operation with the most significant bit (b1) of a control input, and has a decoder 51 to which the lower seven bits (b2 through b8) of the control input are inputted. According to a result of decoding by the decoder circuit 51, the OR circuit 52 converts an indeterminate value (X value) inputted from a specific one of the eight scan paths to a "1" state value (or a "0" state value) whereby the indeterminate value is masked.

When "1" is inputted to the control input pin b1, the output of the OR circuit 53 becomes "1", so that the shift clock (negative clock; Scan Clock) to the F/Fs on the scan paths and the output verifier 7 (and the pseudo-random pattern generator 2) is suppressed, and the AND circuit 55 is brought into the through state by "1" of the control input pin b1. Whereby, a result (an output of the OR circuit 54) of logical sum of an output of the F/F 62 and a selection signal from the decoder 51 is inputted to the OR circuit 52. At the same time, the result is passed through the AND circuit 55 and inputted to the F/F 62. As above, "1" is outputted from the decoder 51 to convert an indeterminate value (X value) having been inputted to a specific one of the eight scan paths to the "1" state value by the OR circuit 52, thereby masking the indeterminate value. When there is simultaneously another indeterminate value in an F/F of another scan path, an output (indeterminate value) from that F/F is masked at the next shift clock. Although a portion of generating patterns and a portion of output verification are basically independent, the lower seven bits of the control inputs can be shared when the both circuits are applied in common.

According to the third embodiment, the output verifier 7 fulfills functions similar to those of the EOR tree circuits 31 and 32 described above in the second embodiment. The output verifier 7 compresses a plurality of outputs shifted out from the scan paths #0 through #7 (OR circuits 52), and outputs them to the outside of the LSI 1C.

The mask 5 has a function as a control circuit which enables one of outputs from the scan paths #0 through #7 to be inputted to the output verifier 7, and a function as a control circuit which enables outputs from scan paths #0 through #7 corresponding to patterns of pattern numbers in a predetermined range generated by the pseudo-random pattern generator 2 in order to narrow down a pattern number where a fault occurs. In order to accomplish the above functions, the mask 5 has a flip-flop (initialization setting F/F) 57, a logical sum circuit (OR circuit) 61 and a multiplexer 56 for each scan path, along with a start counter 58, an end counter 59 and a NAND circuit 60. According to the third embodiment, the control circuit configured with the elements 57 through 61 and the output verifier 7 functioning as the EOR tree circuits together fulfill a function similar to that of the output selector 30 described above in the second embodiment.

The initialization setting F/F 57 forms the scan path as another F/F 57 forming a scan path, to which "0" or "1" is set by scan-in when the test is started. At this time, "0" is set to an F/F for a scan path to be enabled, whereas "1" is set to F/Fs 57 for the remaining scan paths.

Figure 5:
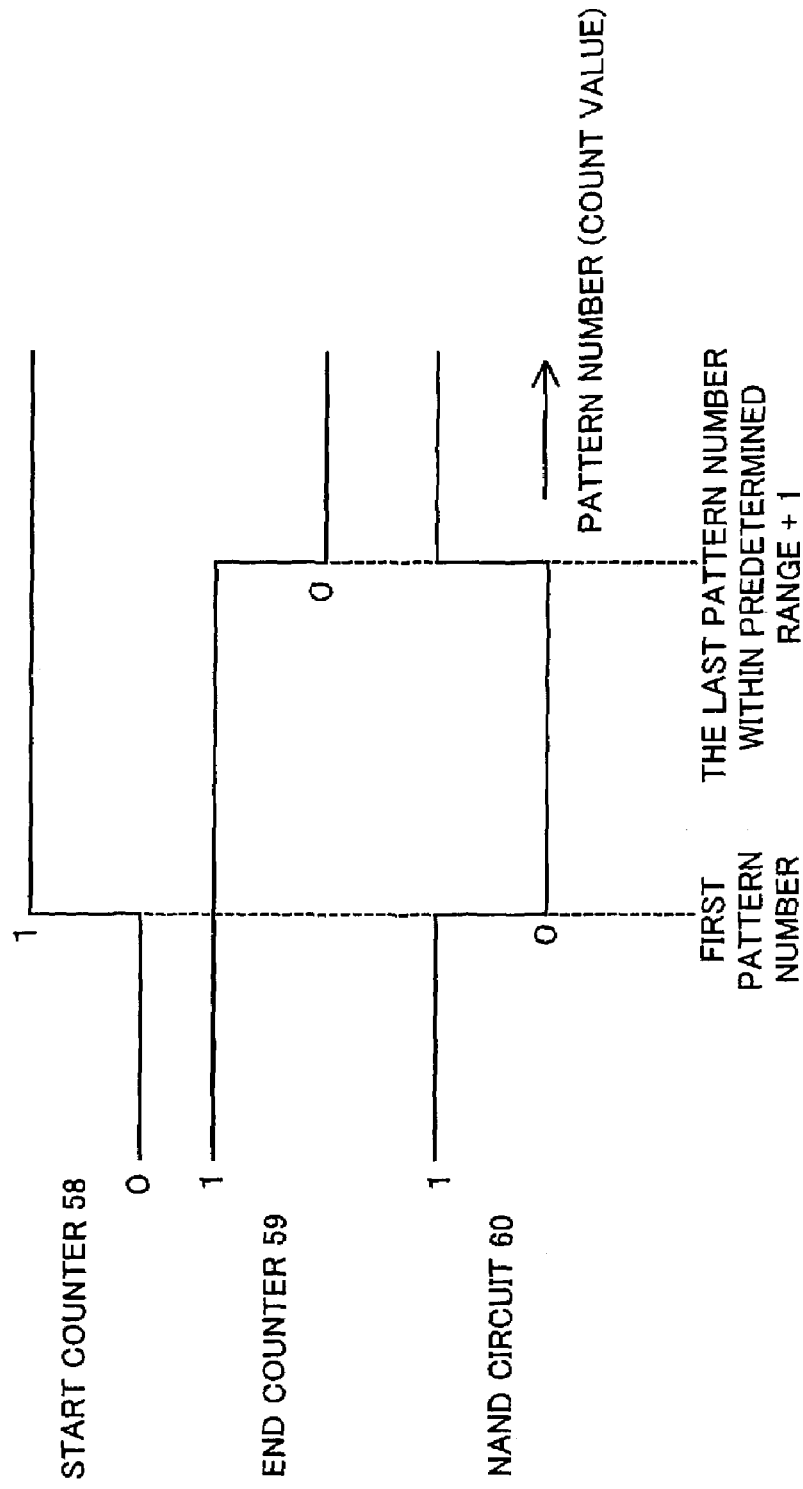
FIG. 5 is a time chart for illustrating an operation according to the third embodiment.
Figure 6:
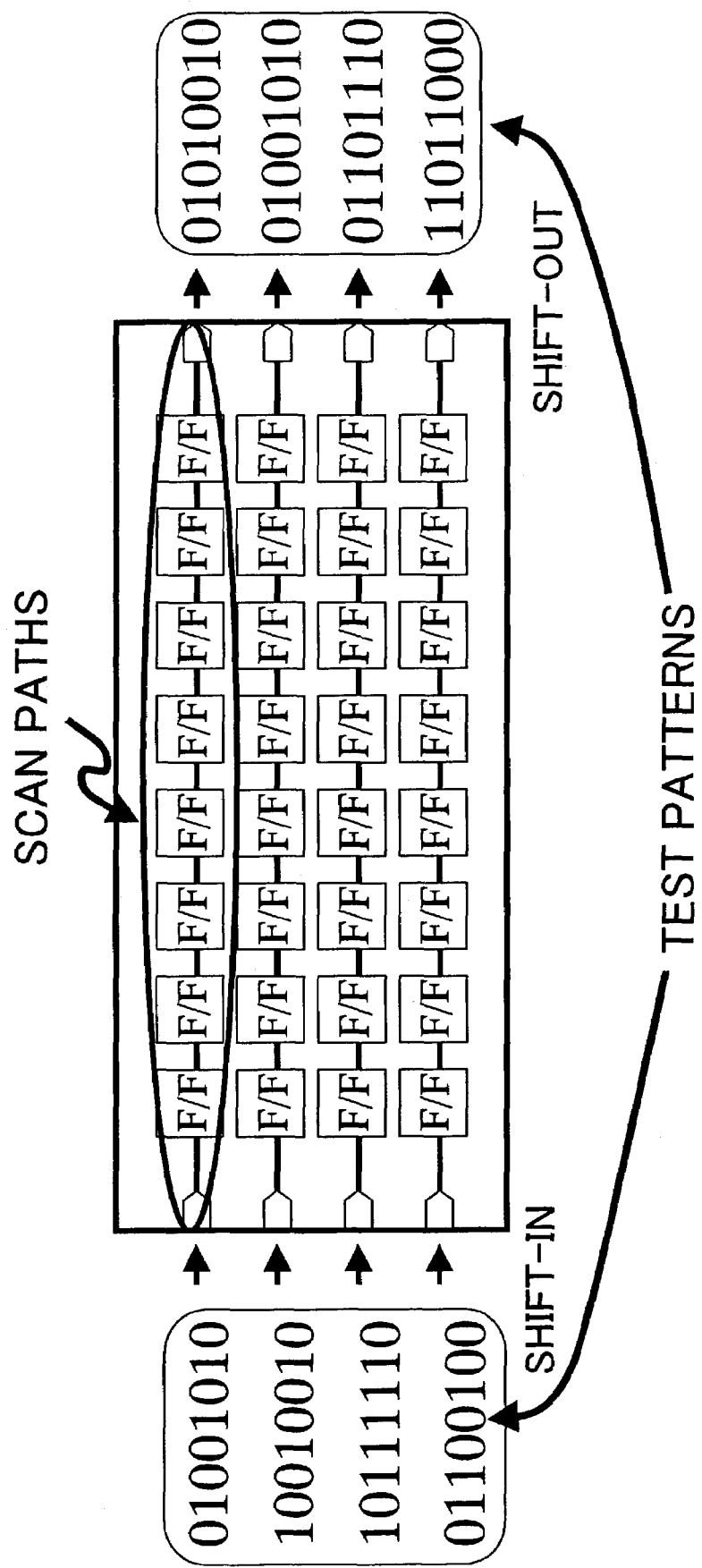
FIG. 6 is a diagram for illustrating a known scan design (DSPT)
Figure 7:
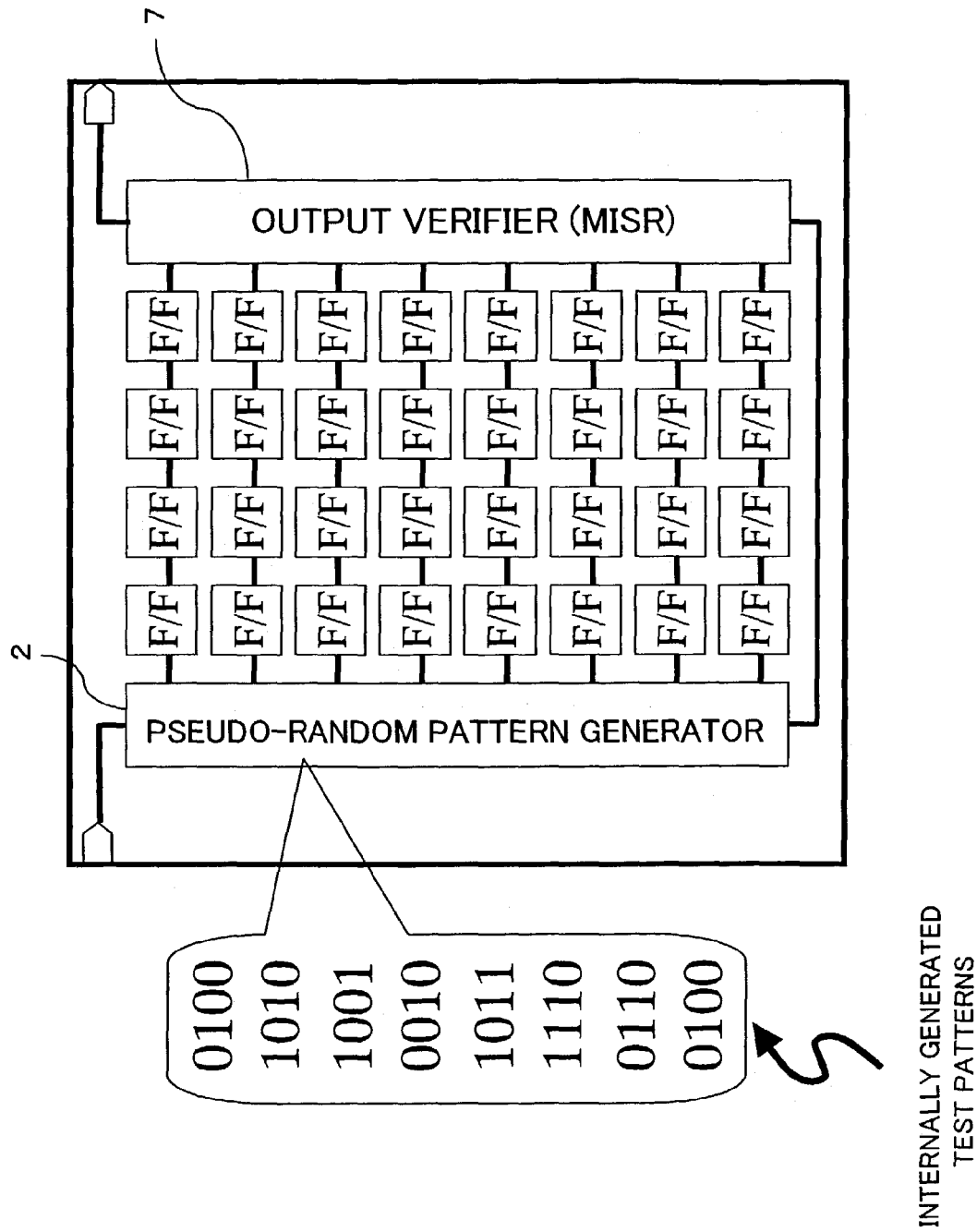
FIG. 7 is a diagram for illustrating a known BIST circuit.

The start counter 58 is used to enable outputs corresponding to pattern numbers in a predetermined range, together with the end counter 59 and the NAND circuit 60. The start counter 58 is set thereto the first pattern number in the predetermined range, starts to count the scan clock when the test is started, and switches the output signal from "0" to "1" when the count value becomes the first pattern number, as shown in FIG. 5.

The end counter 59 is used to enable outputs corresponding to pattern numbers in a predetermined range together with the start counter 58 and the NAND circuit 60. The end counter 59 is set thereto "the last pattern number+1" in the predetermined range, starts to count the scan clock when the test is started, and switches the output signal from "1" to "0" when the count value becomes "the last pattern number+1".

The NAND circuit 60 outputs a negative AND (negative logical product) of an output signal from the start counter 58 and an output signal from the end counter 59. As shown in FIG. 5, while outputs corresponding to pattern numbers in the predetermined range are outputted from a scan paths, the NAND circuit 60 outputs "0" to enable outputs from the scan paths. When outputs corresponding to all test patterns are enabled, for example, "0" is set to the start counter 58 and "the maximum value of pattern numbers+1" is set to the end counter 59. When only outputs corresponding to one test pattern, for example, a number of the test pattern is set to the start counter 58 and "the number of the test pattern+1" is set to the end counter 59.

The OR circuit 61 outputs a logical sum of an output signal from the initialization setting F/F 57 and an output signal from the NAND circuit 60. Only when "0" is set to the initialization F/F 57 and the output signal from the NAND circuit 60 is "0" (that is, at the time of a pattern number in the predetermined range), the OR circuit 61 outputs a result of logical sum "0" to the F/F 62 through the multiplexer 56 to enable the scan path. The multiplexer 56 selectively switches either an output signal from the AND circuit 55 or an output signal from the OR circuit 61 according to an initialization signal Init, and outputs it to the F/F 62.

According to the third embodiment, there is provided a tester (diagnosing means) not shown, as well. An output from the output verifier 7 is inputted to the tester. Output expected values to be obtained when there is no fault (error) are beforehand stored in the tester, and the tester compares the output expected value with an output from the output verifier 7 to make fault diagnosis.

According to the third embodiment, when the LSI 1C under test such as BIST or the like is diagnosed, scan-in is performed on the initialization F/F 57 to set "0" to the initialization F/F 57 corresponding to a scan path to be enabled with or without concurrent faults, in the above structure. Whereby, outputs of the scan paths are enabled one by one. The output verifier 7 compresses enabled outputs and successively outputs them to the outside of the LSI IC. The tester compares an output expected value with an output from the output verifier 7 to make fault diagnosis, and specifies a scan path whose output does not agree with the output expected value as a scan path in which a fault exists.

The above process is repeated plural times (eight times in the LSI IC according to the third embodiment shown in FIG. 4) to diagnose all the scan paths, whereby all fault positions (scan paths in each of which a fault occurs) can be specified.

In the first test, "0" is set to the initialization setting F/F 57 corresponding to the first scan path connected to the output verifier 7 in order to enable only the first scan path, and the test is made on the first scan path.

At the start, values of the start counter 58 and the end counter 59 are so set as to enable outputs corresponding to all test patterns. When it is known by means of the tester that a fault exists in a scan path, as a result of the test with all the test pattern, the values of the start counter 58 and the end counter 59 are suitably changed to select a range of pattern numbers where outputs are to be enabled, and the test is carried out. This process is repeated to narrow down a pattern number (a pattern number where a fault occurs) of a test pattern relating to occurrence of the fault, whereby a position of the fault in the scan path can be specified.

Similar test is repeated n times (n=8 in the third embodiment) to test up to the n-th scan path connected to the output verifier 7. Whereby, it is possible to not only specify all scan paths in which faults exist, but also specify positions of the faults in the scan paths.

Like the second embodiment, outputs to be inputted to the output verifier 7 from a plurality of scan paths are enabled one by one, and the enabled outputs are compressed by the output verifier 7 and successively outputted to the outside of the LSI 1C in the third embodiment. Accordingly, it is possible to accurately specify all scan paths in which faults exist when fault diagnosis is made on an LSI under test such as BIST or the like. Even when there are a number of concurrent faults because a new manufacturing process is started, accurate, certain fault diagnosis is possible.

According to the third embodiment, with the start counter 58, the end counter 59, the NAND circuit 60 and the OR circuit 61, outputs from scan paths corresponding to patterns of pattern numbers in a predetermined range generated by the pseudo-random pattern generator 2 are enabled so that fault diagnosis becomes possible. It is thereby possible to narrow down a pattern number where a fault occurs, and specify a position of the fault in a scan path.

According to the third embodiment, test patterns generated by the pseudo-random pattern generator 2 are modified by the pattern modifier 4, and inputted to plural scan paths, whereby deterministic test patterns generated by the ATPG can be applied to the LSI 1C within a short time. In concrete, if the number of inside scan paths is increased k times, the test time can be shorten to about 1/k. At the same time, the quantity of data of patterns to be stored in the tester can be decreased. Concretely, if the number of inside scan paths is increased k times, the quantity of data can be decreased to about 1/k.

Although the pseudo-random pattern generator (LFSR or the like) 2 used in BIST is utilized, the deterministic pattern adapted inside in the third embodiment, no sever design rule is put on the designer such as providing a special control circuit for bus circuit or inserting a test point for improving fault coverage into the circuit. Additionally, a pattern compressor (MISR or the like) used in BIST can be used, and it is possible to prevent the indeterminate state inside the circuit from being propagated to the output verifier (MISR) 7 by the mask 5, which avoids the unverifiable condition.

According to the third embodiment, test patterns generated by the pseudo-random generator 2 are modified by the pattern modifier 4, and inputted to a plurality of scan paths. It is thereby possible to increase the number of scan paths to decrease the number of stages of the scan paths (the number of F/Fs in each scan path), thus possible to largely shorten the test time for the LSI 1C. A high-quality test is feasible without no sever design rule on the designer and without an expensive tester. Further, an indeterminate value (X value) in outputs from a plurality of scan paths formed with F/Fs inside the LSI 1C is masked by the mask 5, and a result of masked output is verified by the output verifier 7. It is thereby possible to prevent a result of compression from being ruined by the indeterminate value even if the result of outputs from the F/Fs are compressed and read out to the outside.

4 Others

Note that the present invention is not limited to the above examples, but may be modified in various ways without departing from the scope of the invention.

In the above embodiments, eight scan paths are formed in parallel, and each scan path is formed by serially connecting four F/Fs in each of the LSIs 1A, 1B and 1C. However, this invention is not limited to this example.

What is claimed is:

1. A diagnosing apparatus for making fault diagnosis to detect a manufacturing failure of an integrated circuit comprising:
    a pattern generator built in an integrated circuit to generate test patterns;
    a plurality of shift registers formed by sequential circuit elements, said shift registers being arranged in parallel inside said integrated circuit, the test patterns generated by said pattern generator being shifted into said shift registers, respectively;
    an output compressor for compressing a plurality of outputs shifted out from said shift registers by converting the outputs into check bits of a Hamming code, and outputting the compressed outputs as a compressed value to the outside of said integrated circuit through pins fewer in number than that of said shift registers; and
    diagnosing means for comparing an output expected value beforehand obtained with said compressed value from said output compressor to make fault diagnosis,
    wherein when said diagnosing means diagnoses as a result of the comparison that a fault occurs at one position, said diagnosing means obtains a syndrome by calculating an exclusive OR of the output expected value arid the check bits and specifies a shift register in which the fault exists based on the syndrome and an error vector corresponding to the syndrome which error vector has been beforehand given.

2. The diagnosing apparatus for an integrated circuit according to claim 1, wherein when said diagnosing means diagnoses as a result of comparison that faults occur at two or three positions, said diagnosing means indicates presence of said faults.

3. The diagnosing apparatus for an integrated circuit according to claim 1 further comprising:
    a pattern modifier for modifying said test patterns generated by said pattern generator according to an external input, then inputting the modified test patterns to said shift registers.

4. The diagnosing apparatus for an integrated circuit according to claim 1 further comprising:
    a mask for masking an indeterminate value in said outputs from said shift registers; and
    an output verifier for verifying the outputs masked by said mask;
    the outputs of said mask being inputted to said output compressor.

5. A diagnosing method for making fault diagnosis to detect a manufacturing failure of an integrated circuit comprising the steps of:
    generating test patterns by a pattern generator built in an integrated circuit;
    shifting the test patterns generated by said pattern generator into a plurality of shift registers formed by sequential circuit elements, said shift registers being arranged in parallel inside said integrated circuit;
    compressing a plurality of outputs shifted out from said plural shift registers by converting the outputs into check bits of a Hamming code, and outputting the compressed outputs as a compressed value to the outside of said integrated circuit through pins fewer in number than that of said shift registers;
    comparing an output expected value beforehand obtained with said compressed value from said integrated circuit to make fault diagnosis;
    obtaining a syndrome, when it is diagnosed as a result of comparison that a fault occurs at only one position, by calculating an exclusive OR of the output expected value and the check bit from said integrated circuit; and
    specifying a shift register in which the fault exists based on a syndrome and an error vector corresponding to the syndrome which error vector has been beforehand given.

6. The diagnosing method for an integrated circuit according to claim 5, further comprising the steps of:
    indicating presence of the faults when it is diagnosed as a result of comparison that faults occur at two or three positions.

* * * * *

UNITED STATES PATENT AND TRADEMARK OFFICE
CERTIFICATE OF CORRECTION

PATENT NO. : 7,337,379 B2 Page 1 of 1
APPLICATION NO. : 10/355014
DATED : February 26, 2008
INVENTOR(S) : Takahisa Hiraide It is certified that error appears in the above-identified patent and that said Letters Patent is hereby corrected as shown below:

Col. 16, line 3, delete "arid" and insert --and--, therefor.

Col. 16, line 3, after "bits" insert --,--.

Signed and Sealed this

First Day of July, 2008

JON W. DUDAS
*Director of the United States Patent and Trademark Office*